United States Patent
Celik et al.

(10) Patent No.: US 7,968,999 B2
(45) Date of Patent: Jun. 28, 2011

(54) PROCESS OF GROUNDING HEAT SPREADER/STIFFENER TO A FLIP CHIP PACKAGE USING SOLDER AND FILM ADHESIVE

(75) Inventors: Zeki Z. Celik, Sunnyvale, CA (US); Zafer S. Kutlu, Menlo Park, CA (US); Vishal Shah, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 547 days.

(21) Appl. No.: 12/038,911

(22) Filed: Feb. 28, 2008

(65) Prior Publication Data
US 2009/0218680 A1 Sep. 3, 2009

(51) Int. Cl.
*H01L 23/10* (2006.01)
*H01L 23/34* (2006.01)

(52) U.S. Cl. ........ 257/707; 257/712; 257/713; 257/778; 257/E23.08; 257/E23.101; 438/106; 438/108; 438/118; 438/125

(58) Field of Classification Search .................. 438/108; 257/778, 707, E23.08, E23.101
See application file for complete search history.

(56) References Cited

U.S. PATENT DOCUMENTS

| | | | | |
|---|---|---|---|---|
| 5,736,074 | A | * | 4/1998 | Hayes et al. ...................... 264/6 |
| 5,841,194 | A | | 11/1998 | Tsukamoto ................... 257/729 |
| 6,051,888 | A | * | 4/2000 | Dahl ............................. 257/778 |
| 6,114,761 | A | | 9/2000 | Mertol et al. ................. 257/722 |
| 6,472,762 | B1 | | 10/2002 | Kutlu ............................. 257/778 |
| 6,504,096 | B2 | * | 1/2003 | Okubora ....................... 174/521 |
| 6,528,892 | B2 | | 3/2003 | Caletka et al. ................ 257/781 |
| 6,639,321 | B1 | | 10/2003 | Nagarajan et al. ............ 257/778 |
| 6,806,119 | B2 | | 10/2004 | Nagarajan et al. ............ 438/108 |
| 6,933,176 | B1 | * | 8/2005 | Kirloskar et al. ............. 438/122 |
| 2002/0108768 | A1 | * | 8/2002 | Jimarez et al. ............... 174/52.4 |
| 2003/0030140 | A1 | | 2/2003 | Shim ............................. 257/712 |
| 2003/0201309 | A1 | * | 10/2003 | Grigg et al. ................... 228/207 |
| 2004/0104469 | A1 | * | 6/2004 | Yagi et al. ..................... 257/723 |

* cited by examiner

*Primary Examiner* — Angel Roman
(74) *Attorney, Agent, or Firm* — Christopher P. Maiorana, PC

(57) ABSTRACT

A method of grounding a heat spreader/stiffener to a flip chip package comprising the steps of attaching an adhesive film to a substrate and attaching a stiffener to the adhesive film. The adhesive film may have a number of first holes corresponding with a number of grounding pads on the substrate. The grounding pads may be configured to provide electrical grounding. The stiffener may have a number of second holes corresponding with the number of first holes of the adhesive film and number the grounding pads of the substrate. The grounding pads are generally exposed through the first and the second holes.

23 Claims, 3 Drawing Sheets

PROCESS OF GROUNDING HEAT SPREADER/STIFFENER TO A FLIP CHIP PACKAGE USING SOLDER AND FILM ADHESIVE

FIELD OF THE INVENTION

The present invention relates to semiconductor chip assembly generally and, more particularly, to a method and/or architecture for grounding a heat spreader/stiffener to a flip chip package using solder and film adhesive.

BACKGROUND OF THE INVENTION

Conventional package grounding for electromagnetic shielding is done via a heat sink and/or heat spreader. The heat sink and/or heat spreader are connected to a printed circuit board (PCB) using clamps, wires, or some other connecting means. The conventional technique is costly, involves additional manufacturing steps for the PCB, and has handling problems.

SUMMARY OF THE INVENTION

The present invention concerns a method of grounding a heat spreader/stiffener to a flip chip package comprising the steps of attaching an adhesive film to a substrate and attaching a stiffener to the adhesive film. The adhesive film may have a number of first holes corresponding with a number of grounding pads on the substrate. The grounding pads may be configured to provide electrical grounding. The stiffener may have a number of second holes corresponding with the number of first holes of the adhesive film and the number of grounding pads of the substrate. The grounding pads are generally exposed through the first and the second holes.

The objects, features and advantages of the present invention include providing a method and/or architecture for grounding a heat spreader/stiffener to a flip chip package using solder and film adhesive that may (i) provide shielding that is transparent to an end user, (ii) reduce cost, (iii) reduce or eliminate manufacturing steps for printed circuit boards, (iv) reduce or eliminate handling problems, (v) integrate electromagnetic shielding into the integrated circuit package and/or (vi) provide higher reliability than epoxy attachment.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a process and architecture for grounding a heat spreader/stiffener to a flip chip package. Flip chip packages may be identified by manufacturers using designations such as FPBGA, FCPBGA, FCBGA, etc. The present invention generally provides a process for integrating electromagnetic shielding into the package by grounding the heat spreader/stiffener through the package substrate. In one example, a combination of film adhesive and solder may be used to mechanically and electrically connect the heat spreader/stiffener to the package substrate. The shielding provided by the present invention may be transparent to the customer (or end user). The present invention generally eliminates deficiencies of the conventional approach.

Figure 1:
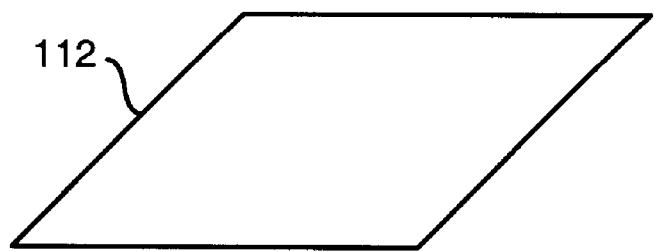
FIG. 1 is a diagram illustrating attachment of a two-piece heat spreader/stiffener to a substrate in accordance with the present invention.
Figure 1:
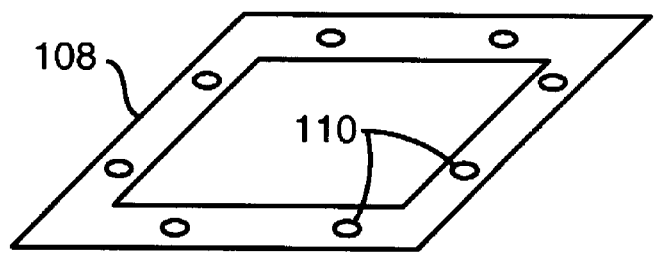
Figure 1:
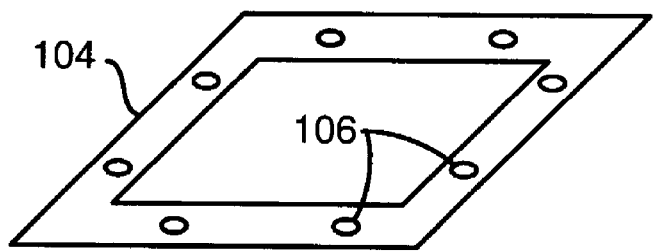
Figure 1:
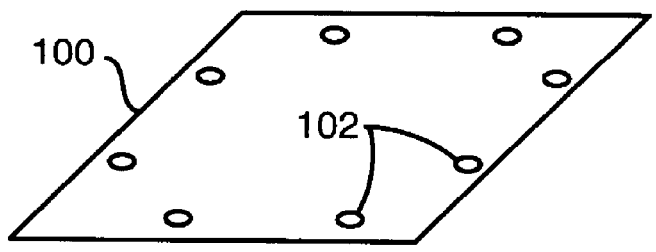

Referring to FIG. 1, a diagram is shown illustrating attachment of a heat spreader/stiffener to a package substrate in accordance with the present invention. In one example, a substrate 100 may be implemented with a number of pads (or traces) 102. The pads 102 may be configured to provide electrical grounding connections. The pads 102 may be coated with a metal (e.g., solder, tin (Sn), nickel (Ni), gold (Au), etc.). In one example, the substrate 100 may be part of a flip chip package. The pads 102 may be on a top surface of the substrate 100 (e.g., internal to the package). The bottom surface of the substrate 100 may comprise, in one example, a ball grid array.

An adhesive film 104 may be applied, attached, adhered to the top surface of the substrate 100. The adhesive film 104 may have a number of holes 106 that may be positioned to correspond to the pads 102 of the substrate 100. In one example, the holes 106 may contain solder. In one example, the adhesive film 104 may be patterned as an annular ring to fit around a die (not shown). The adhesive film 104 may be patterned, in one example, to match a shape of a stiffener 108.

The stiffener 108 may be made of an electrically conductive material. In one example, the stiffener 108 may be metal (e.g., copper, etc.). The stiffener 108 may have a number of holes 110 that may be positioned to correspond to (e.g., collocated with) the pads 102 of the substrate 100 and the holes 106 of the adhesive film 104. The pads 102 are generally exposed (accessible) through the holes 106 and 110. In one example, the holes 106 and 110 may be circular. However, other shape holes may be implemented accordingly to meet the design criteria of a particular implementation.

The holes 110 of the stiffener 108 and the holes 106 of the adhesive film 104 may be prepared for mechanically and electrically connecting the stiffener to the substrate 100 via the pads 102. The stiffener 108 may be attached or adhered to substrate 100 via the adhesive film 104. For example, the stiffener 108 may be attached to substrate using the adhesive film 104. The adhesive film 104 may then be cured. In one example, the holes 106 and the holes 110 may be stenciled with solder paste. In another example, solder may be dispensed into the holes 106 and 110 after the stiffener 108 is attached to the adhesive film 104. In yet another example, flux may be dispensed into the holes 106 and 110 and solder balls dropped in after the flux. In still another example, flux dipped solder balls may be dropped into the holes 110. However, other methods of preparing the holes 106 and 110 to electrically connect the stiffener 108 to the pads 102 may be implemented accordingly to meet the design criteria of a particular implementation.

A heat spreader 112 may be attached to the stiffener 108 such that the heat spreader 112 is electrically connected to the stiffener 108 and the substrate 100. In one example, the heat spreader 112 may be attached to the stiffener 108 using electrically conductive epoxy. In another example, the heat spreader 112 may be further attached to the stiffener 108 via the solder in the holes 106 and 110. However, other methods of mechanically and electrically attaching the heat spreader 112 to the stiffener 108 may be implemented accordingly to meet the design criteria of a particular implementation.

Figure 2:
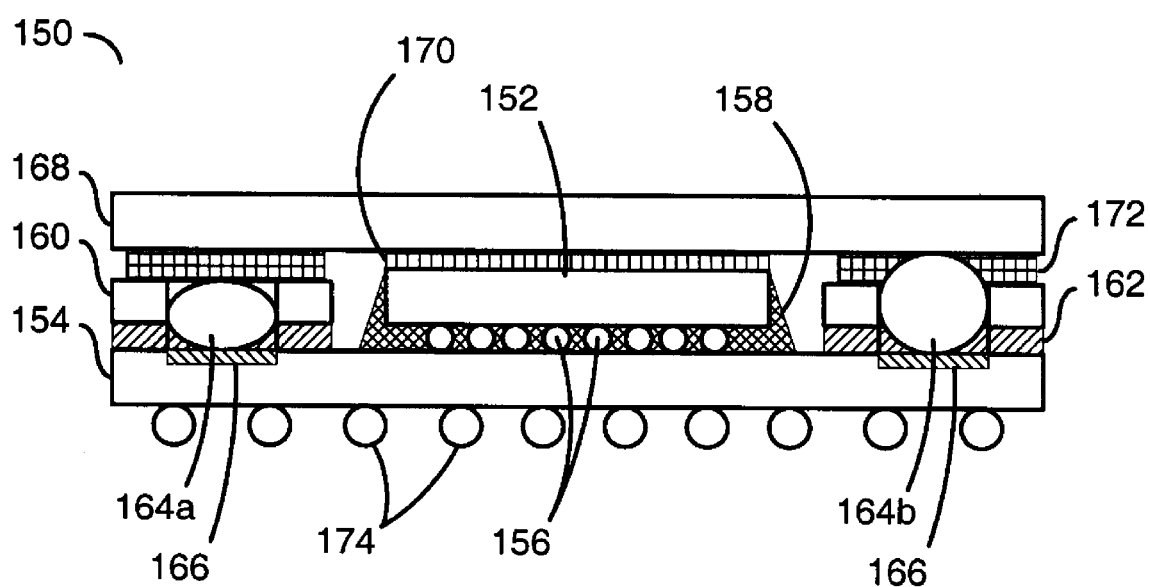
FIG. 2 is a diagram illustrating a cross-sectional view of a two-piece heat spreader/stiffener integrated in accordance with preferred embodiments of the present invention.

Referring to FIG. 2, a diagram is shown illustrating a cross-sectional view of a package 150 in accordance with embodiments the present invention. The package 150 may be implemented as a flip chip package. The package 150 may implement a heat spreader/stiffener grounding scheme in accordance with the present invention. The package 150 may comprise a die 152 attached to a substrate 154 using, for example, flip chip solder bumps 156. A gap between the die 152 and the substrate 154 may be filled with an underfill 158. A stiffener 160 may be attached to the substrate 154 using an adhesive film 162 and solder (or solder balls) 164. The solder 164 may form a mechanical and electrical connection with grounding pads 166 on the substrate 154. In one example, the solder 164 may be configured to attach the stiffener 160 to the pads 166 of the substrate 154 (e.g., illustrated by solder ball 164a).

A heat spreader 168 may be attached to (i) the die 152 using a thermally conductive material 170 and (ii) the stiffener 160 using an electrically conductive material 172. In one example, the solder 164 may be configured to electrically connect both the stiffener 160 and the heat spreader 168 to the pads 166 on the substrate 154 (e.g., illustrated by solder ball 164b). In one example, the thermally conductive material 170 may comprise a low modulus material such as thermal grease. However, other thermally conductive materials may be implemented accordingly to meet the design criteria of a particular implementation. The electrically conductive material 172 may comprise, in one example, a high modulus material such as electrically conductive epoxy, epoxy film, etc. However, other electrically conductive materials may be used to couple the heat spreader 168 and the stiffener 160. In one example, a top (or back) side of the die 152 (e.g., the side facing toward the heat spreader 168) may be grounded using an electrically conductive material for the material 170. The substrate 154 may have, in one example, solder balls 174 on the side opposite the die 152.

Figure 3:
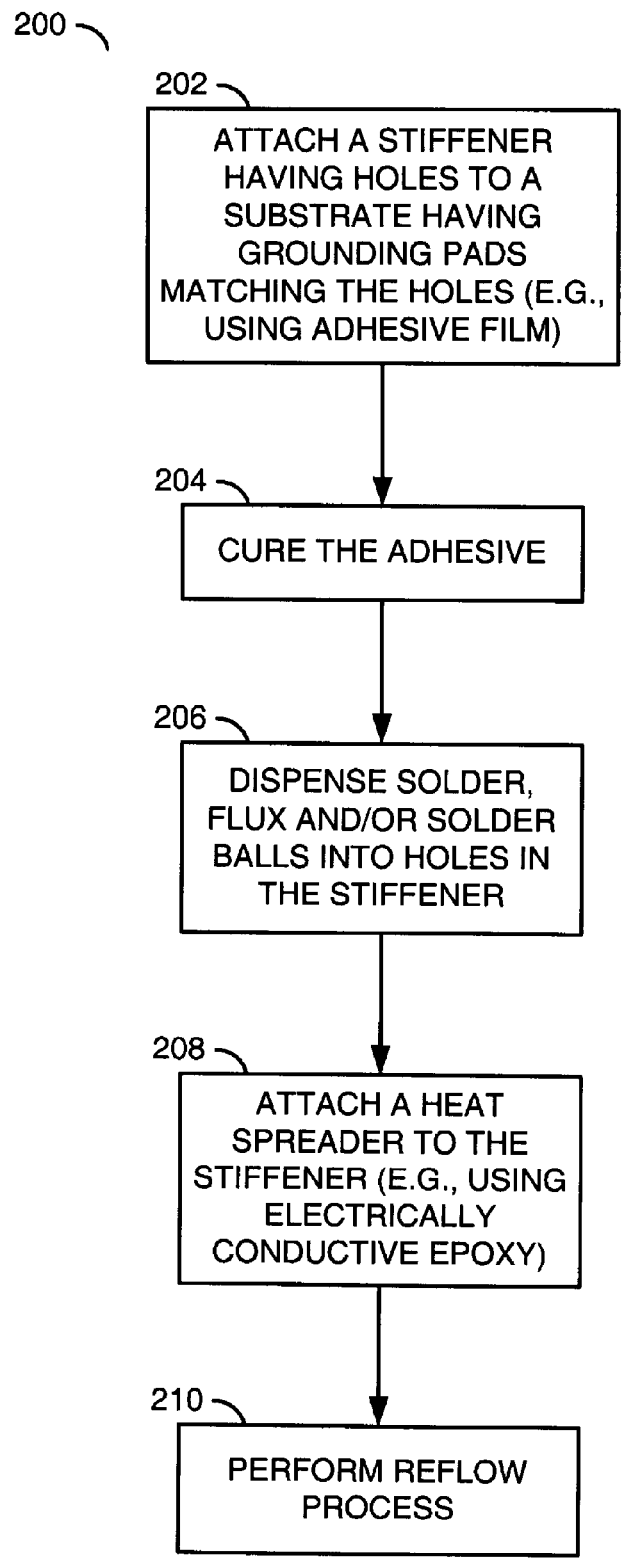
FIG. 3 is a flow diagram illustrating a process in accordance with the present invention.

Referring to FIG. 3, a flow diagram is shown illustrating a process 200 in accordance with a preferred embodiment of the present invention. In one example, the process 200 may comprise a step (or process) 202, a step (or process) 204, a step (or process) 206, a step (or process) 208, and a step (or process) 210. The step 202 generally comprises attaching a stiffener to a substrate using, in one example, an adhesive film. The stiffener and the adhesive film may have holes corresponding to grounding pads on the substrate. The step 204 generally comprises curing the adhesive film. The step 206 generally comprises dispensing one or more of solder, flux and/or a solder ball into the holes in the stiffener. The step 208 generally comprises attaching a heat spreader to the stiffener using, in one example, electrically conductive epoxy. The step 210 generally comprises a reflow process during which the solder (or solder balls) in the holes of the stiffener forms a solid solder-pad and solder-stiffener (or solder-stiffener-heat spreader) interface. In one example, a die and capacitors, if any, may be attached to the substrate using conventional techniques prior to the attachment of the stiffener.

While the invention has been particularly shown and described with reference to the preferred embodiments thereof, it will be understood by those skilled in the art that various changes in form and details may be made without departing from the scope of the invention.

The invention claimed is:

1. A method of grounding a heat spreader/stiffener to a flip chip package comprising the steps of:
   attaching an adhesive film to a substrate, wherein said adhesive film has a number of first holes corresponding with a number of grounding pads on said substrate, said grounding pads configured to provide electrical grounding;
   attaching a stiffener to said adhesive film, said stiffener having a number of second holes corresponding with the number of first holes of the adhesive film and the grounding pads of the substrate, wherein the grounding pads are exposed through the first and the second holes
   attaching a die containing an integrated circuit to the substrate; and
   attaching a heat spreader to said die and said stiffener such that said die is electrically connected to the grounding pads of the substrate.

2. The method according to claim 1, further comprising:
   stenciling solder paste within the second holes.

3. The method according to claim 1, further comprising:
   dispensing solder paste within the second holes.

4. The method according to claim 1, further comprising:
   dispensing flux within the second holes; and
   dropping solder balls within the second holes.

5. The method according to claim 1, further comprising:
   dropping flux coated solder balls into the second holes.

6. The method according to claim 1, wherein:
   said heat spreader is attached to said stiffener such that said heat spreader is electrically connected to the grounding pads of the substrate.

7. The method according to claim 1, wherein said die is attached to said heat spreader using an electrically conductive material.

8. The method according to claim 1, wherein said die is attached to said substrate prior to attachment of said stiffener.

9. An apparatus comprising:
   a substrate having a number of grounding pads configured to provide electrical grounding;
   a stiffener having a number of first holes corresponding with the number of grounding pads of the substrate;
   an adhesive film having a number of second holes corresponding with the number of grounding pads and the number of first holes, wherein the adhesive film is configured to mechanically attach the stiffener to the substrate such that the grounding pads are exposed through the first and the second holes;
   a die configured to electrically attach to the substrate, wherein the die is electrically attached to a heat spreader and said heat spreader is electrically connected to said grounding pads.

10. The apparatus according to claim 9, wherein said grounding pads are coated with metal.

11. The apparatus according to claim 9, further comprising:
    solder paste within the first and the second holes.

12. The apparatus according to claim 9, further comprising:
    flux and solder balls within the first and the second holes.

13. The apparatus according to claim 9, wherein solder electrically connects the stiffener to the grounding pads via the first and the second holes.

14. The apparatus according to claim 9, wherein solder electrically connects the stiffener and a heat spreader to the grounding pads via the first and the second holes.

15. The apparatus according to claim 9, further comprising:
    an area array interconnect of solder bumps configured to mechanically and electrically connect the die to the substrate.

16. The apparatus according to claim 9, wherein the die is attached to said heat spreader by electrically conductive material.

17. The apparatus according to claim 9, wherein a side of the die opposite the substrate is electrically grounded through an electrically conductive path comprising said heat spreader, said stiffener and said grounding pads.

18. A flip chip packaged integrated circuit comprising:
   a substrate having a number of grounding pads configured to provide electrical grounding;
   a stiffener having a number of first holes corresponding with the number of grounding pads of the substrate;
   an adhesive film having a number of second holes corresponding with the number of grounding pads and the number of first holes, wherein the adhesive film is configured to mechanically attach the stiffener to the substrate such that the grounding pads are exposed through the first and the second holes
   a die electrically connected to the substrate; and
   a heat spreader electrically connected to said die, said stiffener and said grounding pads.

19. The flip chip packaged integrated circuit according to claim 18, further comprising:
   solder paste within the first and the second holes.

20. The flip chip packaged integrated circuit according to claim 18, further comprising:
   flux and solder balls within the first and the second holes.

21. The flip chip packaged integrated circuit according to claim 18, wherein:
   said heat spreader is connected to said die and said grounding pads via one or more electrically conductive materials.

22. The flip chip packaged integrated circuit according to claim 21, wherein the heat spreader is attached to the stiffener using electrically conductive epoxy.

23. The flip chip packaged integrated circuit according to claim 21, wherein the heat spreader is attached to the stiffener via solder in the first and second holes.

\* \* \* \* \*